(12) United States Patent
Decaux et al.

(10) Patent No.: US 9,768,792 B1
(45) Date of Patent: Sep. 19, 2017

(54) ASYNCHRONOUS SIGMA-DELTA ANALOG-TO-DIGITAL CONVERTER

(71) Applicant: ITRON, INC., Liberty Lake, WA (US)

(72) Inventors: Pierre Decaux, Orsay (FR); Steven A. Grey, Walhalla, SC (US)

(73) Assignee: ITRON, INC., Liberty Lake, WA (US)

( * ) Notice: Subject to any disclaimer, the term of this patent is extended or adjusted under 35 U.S.C. 154(b) by 0 days.

(21) Appl. No.: 15/395,318

(22) Filed: Dec. 30, 2016

(51) Int. Cl.
*H03M 3/00* (2006.01)
*H03M 1/06* (2006.01)
*H03M 1/12* (2006.01)

(52) U.S. Cl.
CPC ....... *H03M 1/0626* (2013.01); *H03M 1/1245* (2013.01); *H03M 3/458* (2013.01)

(58) Field of Classification Search
CPC .......... H03M 3/43; H03M 3/456; H03M 3/39; H03M 1/504; H03M 1/60; H03M 3/458; H03M 3/326; H03M 3/35; H03M 1/1042; H03M 1/54; H03M 3/462
USPC .................................................. 341/143, 164
See application file for complete search history.

(56) References Cited

U.S. PATENT DOCUMENTS

| | | | | |
|---|---|---|---|---|
| 5,559,514 A * | 9/1996 | Thomson | .............. | G01K 1/20 341/143 |
| 5,907,299 A * | 5/1999 | Green | .............. | H03M 3/02 341/143 |
| 6,147,631 A * | 11/2000 | Maulik | .............. | H03M 3/35 341/122 |
| 6,965,339 B2 * | 11/2005 | Midya | .............. | H03M 3/00 341/126 |
| 7,142,606 B2 * | 11/2006 | Talwalkar | .............. | H03M 3/474 208/317 |
| 8,816,888 B2 * | 8/2014 | Kumakura | .............. | H03M 1/462 341/122 |
| 2009/0261998 A1 * | 10/2009 | Chae | .............. | H03M 3/46 341/118 |
| 2011/0050474 A1 * | 3/2011 | Kang | .............. | H03L 7/0814 341/143 |
| 2014/0340248 A1 * | 11/2014 | Trampitsch | .............. | H03M 3/472 341/143 |
| 2014/0368222 A1 * | 12/2014 | Curtis | .............. | G01D 5/2405 324/672 |

* cited by examiner

*Primary Examiner* — Linh Nguyen

(57) ABSTRACT

A device and method for processing a signal, the method including, by a modulator (1250), receiving an analog signal, modulating the analog signal, and outputting a data frame (1258); receiving, by a counter (1368), the data frame from the modulator and outputting at least two data word sets (1370) each in accordance with a respective one of at least two counter clocks (1372); filtering, by each of at least two digital filter sets (1374), a respective data word set of the at least two data word sets received from the counter, and each outputting, to a switch (1378), a respective filtered data word set (1376). The switch may be configured to select, as an output, one of the filtered data word sets. The switch may be configured to change to a different selected filtered data word set upon detection of a change in line frequency and/or phase.

25 Claims, 18 Drawing Sheets

US 9,768,792 B1

ASYNCHRONOUS SIGMA-DELTA ANALOG-TO-DIGITAL CONVERTER

FIELD OF THE DISCLOSURE

This disclosure relates generally to applied signal processing. More specifically, this disclosure relates to periodic signal processing in energy measurement devices.

BACKGROUND

In many current energy measurement devices (e.g., metering devices), an acquisition buffer of a fixed amount of time is used for sampling voltage and current signals. This fixed duration of time typically accommodates a fractional (non-integer) number of line cycles (e.g., half or full line cycles), which causes, for example, measurements of metrological values from the acquisition buffer (e.g., root mean square (RMS) determinations, energy measurements, etc.) to fluctuate. Previous and current solutions attempt to remedy this problem by averaging several successive time periods worth of data, making measurements on a partial buffer, and/or applying windowing to the associated Fourier transform. However, these solutions can be slow and expensive due to the additional computation(s) and the additional memory that may be required. Further, these solutions may not provide consistent results.

There are other issues that can occur when sampling voltage and current signals for energy measurement. For example, to be cost effective, it would be beneficial for energy measurement devices to use less expensive sigma-delta (or delta-sigma) analog-to-digital converters (ADCs). In general, a sigma-delta ADC encodes a received analog signal using high-frequency sigma-delta modulation, applies a digital filter, and outputs a higher-resolution but lower sample-frequency digital signal. Sigma-delta ADCs are intended to operate at a fixed frequency, however. If a sigma-delta ADC incurs a frequency rate change when the ADC is active, the output samples from the ADC may have significant errors due to the effects of the particular internal modulators and filters used in the ADC. For this reason, sigma-delta ADCs are not typically used in designs where frequency changes, or phase changes, will occur or are required/expected. Typically, a Successive Approximation Register (SAR) ADC would be used instead.

Solutions that overcome these signal sampling issues are needed, in particular for energy measurement devices and other types of devices that require highly accurate output.

Figure 1:
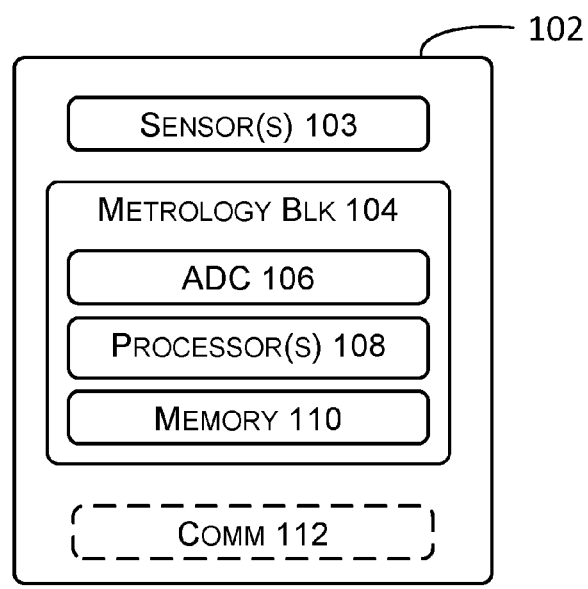
FIG. 1 is a block diagram of an example metering device, in which example methods, apparatus, and articles of manufacture disclosed herein may be implemented, according to embodiments of this disclosure.

In the drawings, the leftmost digit(s) of a reference number may identify the drawing in which the reference number first appears.

DETAILED DESCRIPTION

In metering systems and other applications that require highly accurate output, it is important to control output fluctuations, or manage the effects thereof, due to, for example, sampling frequency and/or phase changes that may occur, or are expected to occur, during operation. There are some ADCs and related solutions that may be able to manage these sampling frequency and/or phase changes, but these solutions can be expensive and may be very slow, inaccurate, or inconsistent. The following description discloses a solution that is faster, more accurate, and less expensive than previous solutions.

Embodiments are now described with reference to the figures, where like reference numbers may indicate identical or functionally similar elements. While specific configurations and arrangements are discussed, it should be understood that this is done for illustrative purposes only. A person skilled in the relevant art will recognize that other configurations and arrangements can be used without departing from the spirit and scope of the description. It will be apparent to a person skilled in the relevant art that the technology disclosed herein can also be employed in a variety of other systems and applications other than what is described herein.

Acquisition Buffer Length

FIG. 1 is a block diagram of an example metering device 102, according to embodiments. Metering device 102 may include a device that measures consumption of a resource, such as, for example, electrical energy (in, for example, energy usage values (such as watt-hours, volt-ampere-hours, reactive volt-ampere-hours, etc., or root mean square values (e.g., Vrms))). While the description herein describes embodiments related to electricity metering devices, the description may apply to other metering devices (such as devices that measure gas, oil, water, etc.) or other devices, including any devices that process periodic waveform signals or involve single tone signals.

Metering device 102 may include one or more metrology sensors 103 (e.g., one or more voltage and current sensors in, for example, an electricity meter) a metrology block 104 that may include, for example, an ADC 106, one or more processors 108 and a memory 110. Metering device 102 may also include a communications block 112 that would allow metering device 102 to communicate within an information network, such as, for example, an advanced meter reading (AMR) network or other similar network. An example of such a network is shown in FIG. 2.

Figure 2:
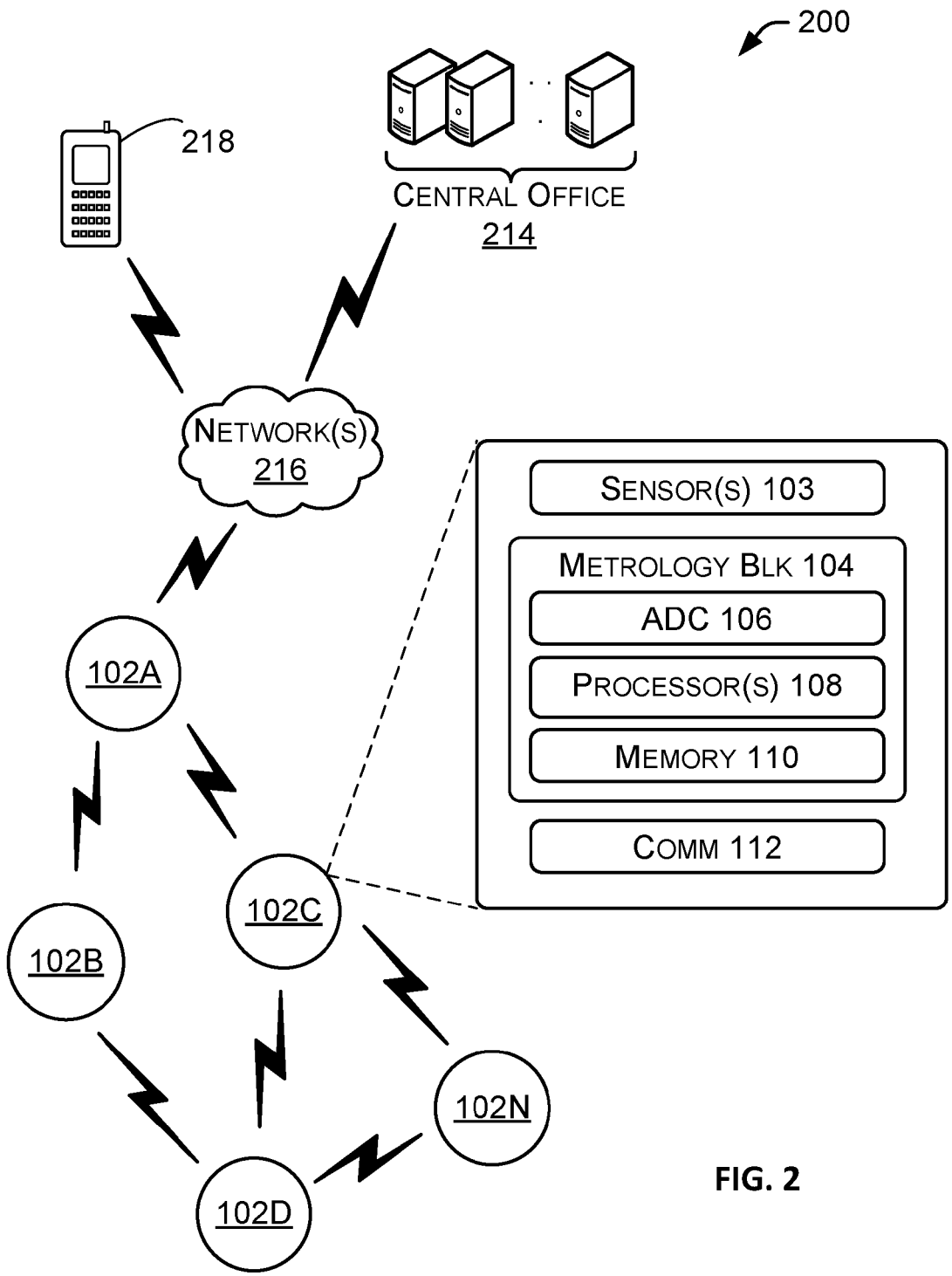
FIG. 2 is an illustration of a network environment in which the example metering device of FIG. 1, or other example methods, apparatus, and articles of manufacture disclosed herein may be implemented, according to embodiments of this disclosure.

FIG. 2 illustrates an example data collection network 200 (e.g., an advanced meter reading (AMR) network or other similar network), according to embodiments. The data collection network 200 may include a central office 214, which may be associated with a data collection/processing entity (e.g., a utility company in the case of an AMR network). The central office may communicate with network nodes through one or more networks 216, which may be the Internet or other network having widespread or local functionality. Network nodes may include nodes 102A-102N (collectively, nodes 102), which may include, for example, endpoint devices such as utility meters or other devices that may comprise sensors, actuators, etc. These nodes/devices may be located at various locations (e.g., homes, businesses, etc.). Nodes/devices 102 may be configured in a mesh network, star network or other configuration. One or more of the network nodes (e.g., device 102A) may be a data collector and/or concentrator that may be configured for wired or wireless communication (e.g., radio frequency (RF) communication, cellular communication, etc.) with a plurality of downstream devices 102B-102N, which may also be configured for similar communications. In an example operation, node/device 102A may relay (i.e., send or receive) data or other communications between itself and/or any of endpoint devices 102B-102N and a data collection device, such as a device located at central office 214 and/or one or more mobile data collection devices 218. For example, for an AMR network, the collected data may include consumption data or other information associated with a utility meter (e.g., an electricity utility meter). Additionally, node/device 102A may send software updates, firmware updates, instructions or other information (which may have been communicated to node/device 102A from central office 214 or mobile data collection device 218, for example) to one or more of the endpoint devices 102B-102N. In an embodiment, one or more network nodes (e.g., devices 102A-102N) may be battery-operated devices.

Figure 3:
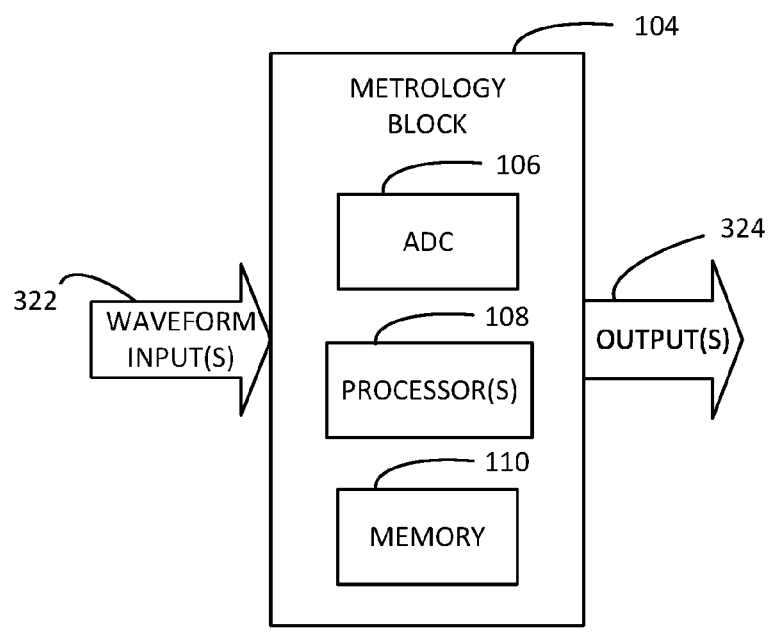
FIG. 3 is a block diagram of a portion of an example metering device, according to embodiments of this disclosure.

In the example of an electricity metering device, a metering device 102 may include circuitry (not shown) to provide periodic waveform signal(s) representative of voltage and current detected at sensor(s) 103 to be sampled for consumption measurement. As shown in FIG. 3, waveform signal(s) 322 are input to metrology block 104, and a periodic waveform output signal 324 is output from metrology block 104. Output signal 324 may include metrological data representative of consumption measurement data, for example.

Figure 4:
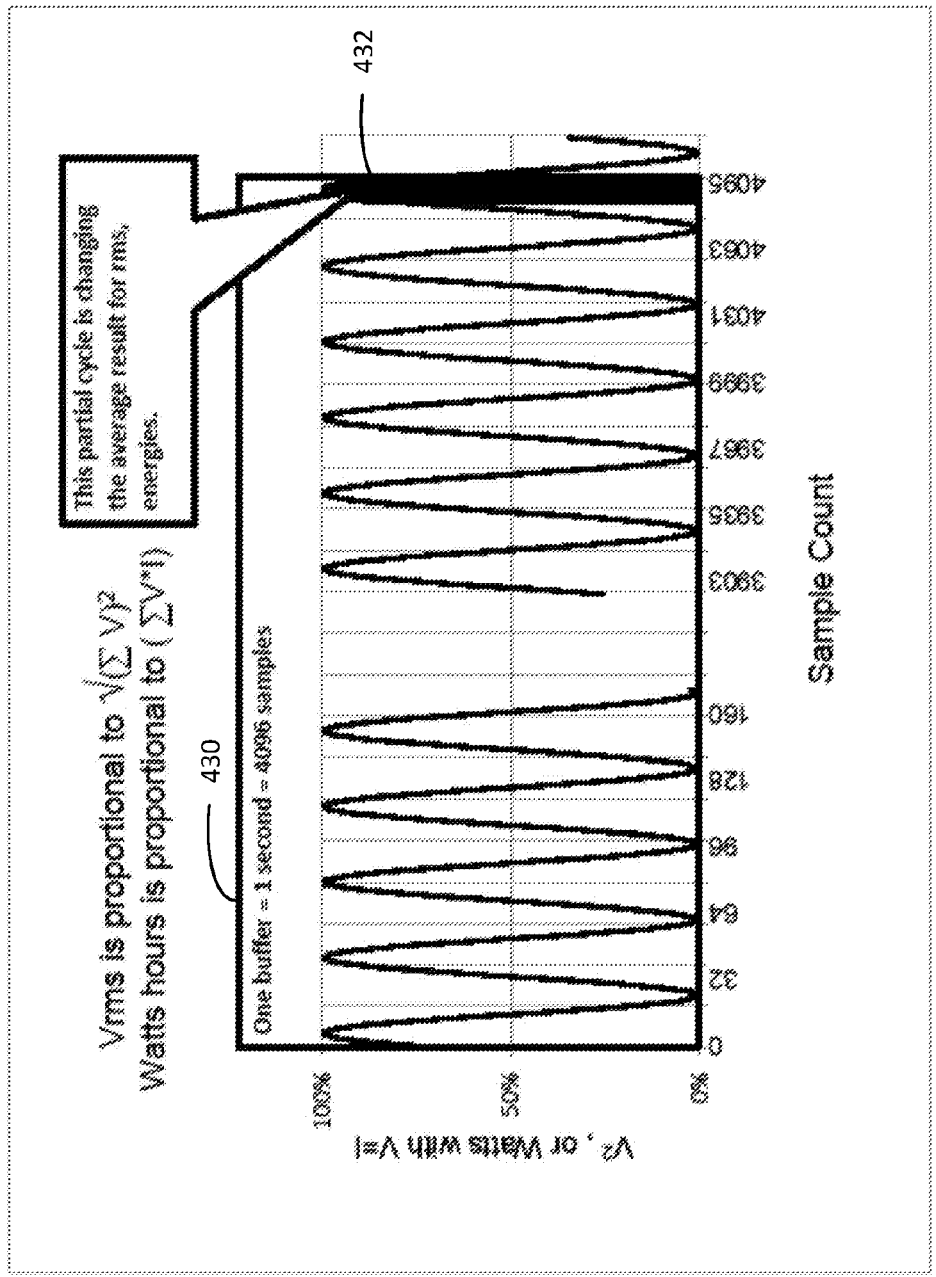
FIG. 4 is a plot example showing energy measurement in terms of line cycles with a number of samples read over a fixed period of time (e.g., 4096 samples in one second).

As stated earlier, in many current energy measurement devices (e.g., metering devices), an acquisition buffer of a fixed amount of time is used for sampling input signals. This fixed duration of time typically accommodates a fractional (non-integer) number of line cycles (e.g. half or full line cycles), which causes, for example, metrological measurements (e.g., root mean square (RMS) determinations, energy measurements, etc.) to fluctuate in value. The plot shown in FIG. 4 depicts an example of this. In the example, a one-second acquisition buffer (denoted by box 430) includes approximately 4096 samples. However, this one second acquisition buffer contains a partial line cycle 432. This partial line cycle will cause an unwanted aberration (e.g., an inflation or deflation) in the average result for the measurement being taken (in this example, Vrms or Watts with voltage (V) equal to current (I)), providing inaccurate and inconsistent results. One way to improve the accuracy and consistency of the results is to vary the acquisition buffer length and optimize the number of samples per buffer to minimize the occurrence and/or severity of partial line cycles. The method shown in FIG. 5 is an example way of accomplishing this, according to an embodiment.

Figure 5:
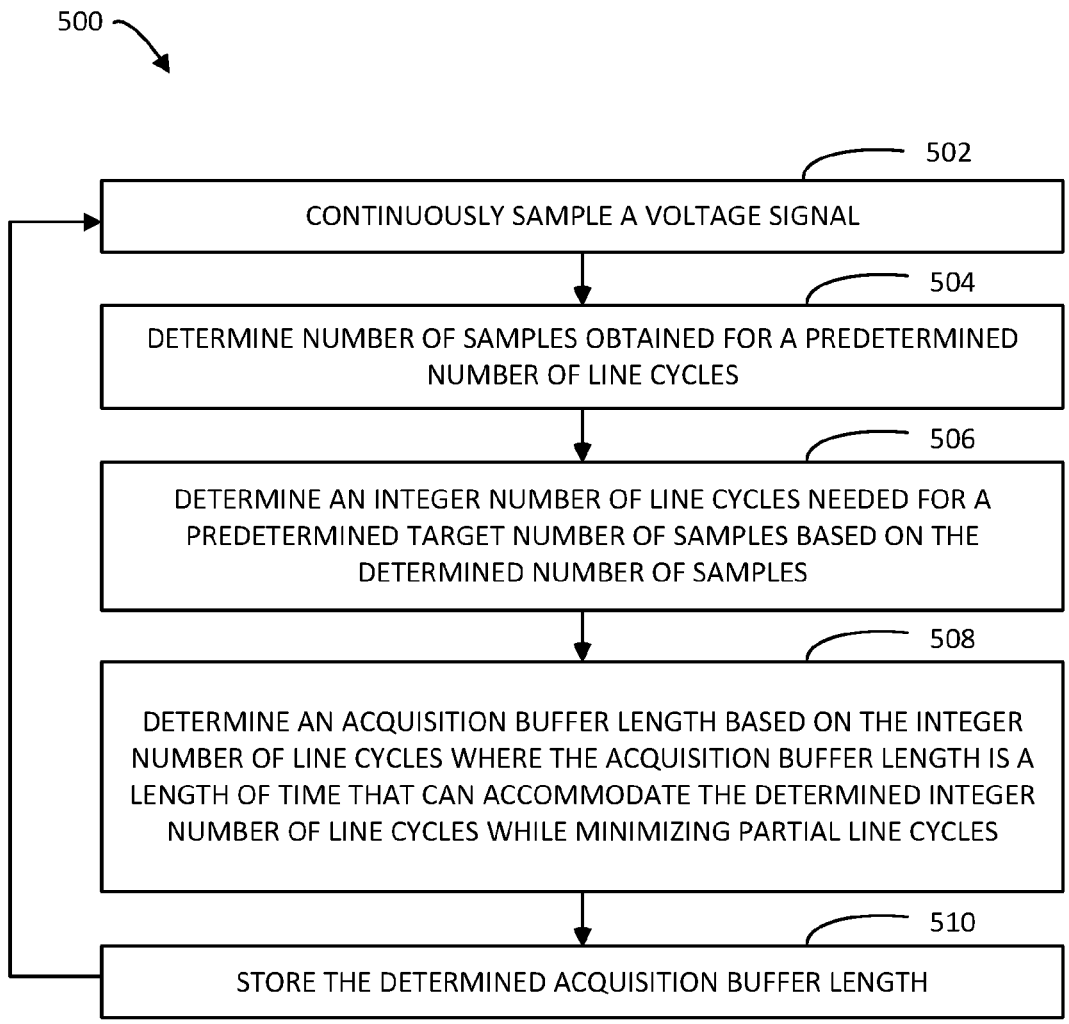
FIGS. 5 and 6 are flow diagrams of example methods of determining a variable acquisition buffer size, according to embodiments of this disclosure.

Method 500 of FIG. 5 is an example method of determining a variable acquisition buffer size, according to embodiments of this disclosure. At 502, an input voltage signal may be continually sampled. For example, in metrology block 104, ADC 106 may continuously sample an input voltage signal, convert the signal into a digital signal, and provide the digital signal to processor(s) 108. At 504, processor(s) 108 may determine, or count, a number of samples obtained for a predetermined number of line cycles. In an example, the predetermined number of line cycles may be a subset of a target number of line cycles that is desired for the acquisition buffer (e.g., for a target number of line cycles of 4096, one may choose 64 line cycles for the sample count (e.g., for 4096 line cycles, a value of 64 has a sufficient duration that also allows a divide with a bit shift because it is a power of 2), though other values may be used). At 506, processor(s) 108 may determine an integer number of line cycles needed for a predetermined target number of samples based on the counted number of samples. In an example, the predetermined target number of samples may be an approximation of how many samples occur in a given time period. For example, 4096 samples may be a chosen predetermined target number of samples because approximately 4096 samples may occur in one second. At 508, processor(s) 108 may determine an acquisition buffer length (as a length of time) based on the determined integer number of line cycles, where the acquisition buffer length is the length of time needed to accommodate the determined integer number of line cycles while minimizing the occurrence, and/or severity, of a partial line cycle. Ideally, the acquisition buffer length would be a length of time in which the determined integer number of line cycles would occur without any partial line cycle. At 510, the determined acquisition buffer length may be stored in memory 110 for use in processing the incoming signals (e.g., for use in sampling the voltage and current for measuring resource consumption). Method 500 may be repeated to continually adjust the acquisition buffer length in case of sampling frequency fluctuations, for example.

In an embodiment, the determined acquisition buffer length (determined at 508) may be checked against a threshold value to determine if it should be stored. This is shown in method 600 of FIG. 6 (at 612). If the determined acquisition buffer length is within the threshold, it is stored (at 510) for use in further operations. If the determined acquisition buffer length is not within the threshold, the determined acquisition buffer length is not stored, and instead the previously stored acquisition buffer length may continue to be used.

Figure 6:
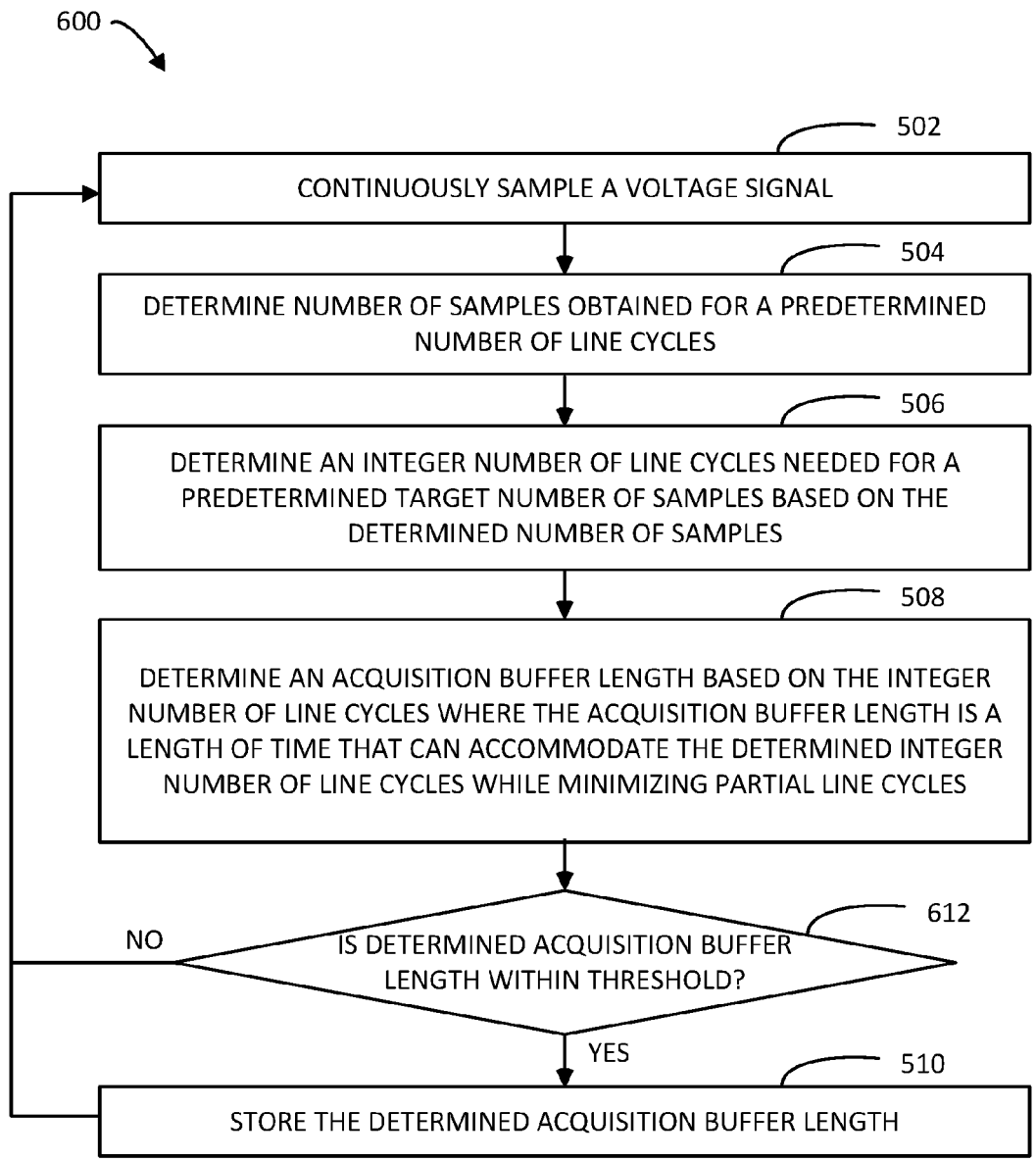
Figure 7:
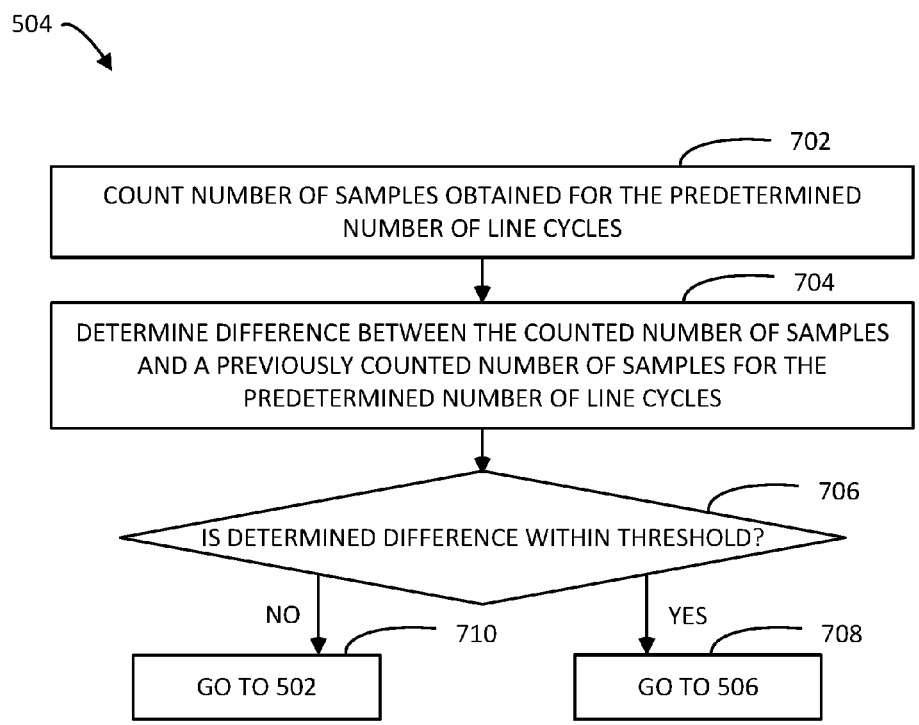
FIG. 7 is a flow diagram of an example method of carrying out step 504 of FIGS. 5 and 6, according to embodiments of this disclosure.

In embodiments, step 504 of FIGS. 5 and 6 (i.e., determining the number of samples obtained for a predetermined number of line cycles) may be performed as shown in FIG. 7. At 702, processor(s) 108 may count the number of samples obtained for the predetermined number of line cycles. At 704, processor(s) 108 may determine the difference between the counted number of samples and the previously counted number of samples for the predetermined number of line cycles. At 706, processor(s) 108 may determine whether the determined difference is within a threshold. If the determined difference is within the threshold, the process may continue at 506. If the determined difference is not within the threshold, the process may skip actions 506-510 and return to 502, continuing to use the previously stored acquisition buffer length. If the determined difference is not within the threshold, there may have been a significantly large change in line frequency, which may indicate issues or problems in the meter. In this situation, using this determined acquisition buffer length may result in skewed or inaccurate measurements.

The following is a more detailed example showing another way to perform the above-described method. In this example, further threshold checks are performed.

For determining the number of samples obtained for a predetermined number of line cycles (504):
  Count the number of samples for 64 cycles:

$cnt64c.n2$

Determine the difference between this count and the previous one:

$cnt64c.delta = cntc4c.n2 - cnt64c.n1$

Determine whether the difference is within a threshold:
    If [minX<=cnt64c.delta<=maxX], continue process, otherwise go back to 502 and use previously stored acquisition buffer length.
  Determine the sum of the last two 64 cycle counts:

$cnt128.n2 = cnt64c.n2 + cnt64c.n1$

Determine whether the 128 cycle sum is within a threshold based on the previous 128 cycle sum:

$cnt128.n1 = cnt64c.n0 + cnt64c.n1$

If [cnt128.n1-1]<=cnt128.n2[cnt128.n1+1], continue process, otherwise go back to 502 and use previously stored acquisition buffer length.
For determining the integer number of line cycles for a predetermined target number of samples (506):
  Determine the number of line cycles closest to 4096 samples:

$cnt1c = one\_cycle\_sample\_count = cnt128c/$
  $128cycles.cnt = round(one\_second\_sample\_count/cnt1c)$ For determining the acquisition buffer length (508):
  Determine the buffer length for cycles.cnt cycles:

$temporary.buffer.length = round(cnt1c*cycles.cnt)$

For determining whether the determined acquisition buffer length is within a threshold (612):
  Determine whether the determined acquisition buffer length is within a threshold:
    If [minY<=temporary.buffer.length<=maxY], continue process, otherwise go back to 502 and use previously stored acquisition buffer length.
For storing the determined acquisition buffer length (510):

$buffer.length = temporary.buffer.length$

Figure 8:
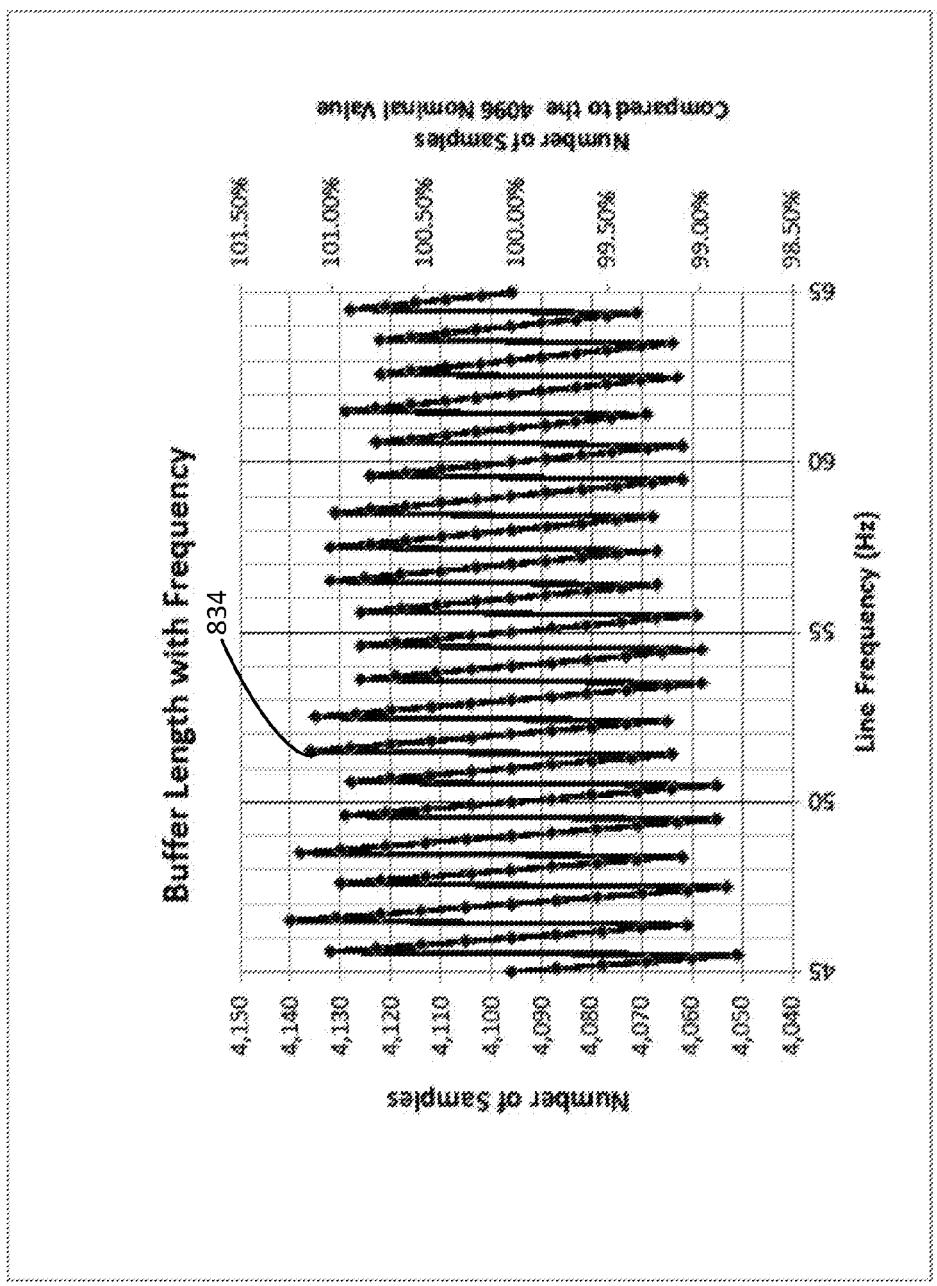
FIG. 8 is a plot example showing number of samples over line frequency where partial line cycles are minimized, according to embodiments of this disclosure.

FIG. 8 is an example plot 834 showing number of samples over line frequency where partial line cycles are minimized using a method according to embodiments described herein. As shown in this particular example, the number of samples is shown to range from about 4050 samples to about 4140 samples, and these values range between about 98.75% to 101.25% of a nominal 4096 sample value. Thus, while 4096 samples is a good target value, by allowing the sample size to vary to more optimal values (even slightly as shown here) to minimize (or ideally eliminate) partial cycles, better results may be achieved.

Figure 9A:
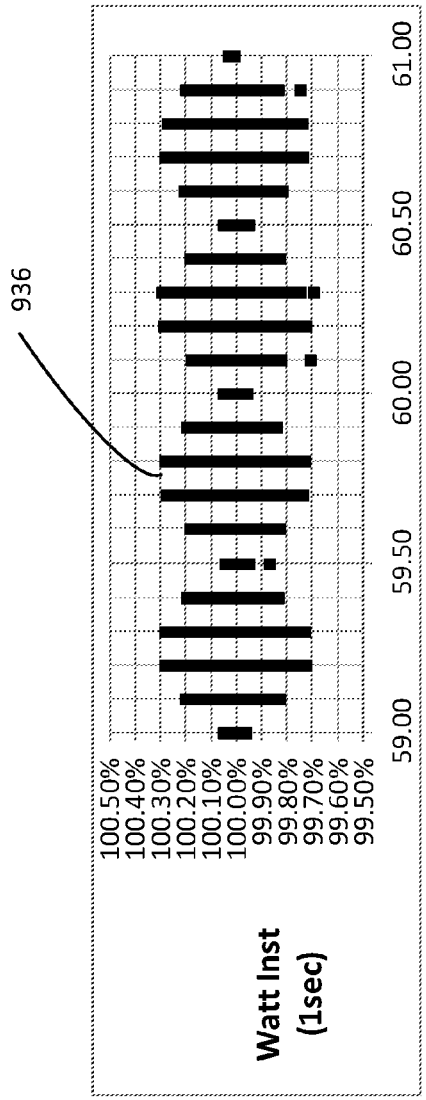
FIGS. 9A and 9B are bar graph examples showing minimum/maximum values of fluctuating power over a sweeping frequency, with FIG. 9A including values when using a fixed acquisition buffer time, and with FIG. 9B including values when using variable acquisition buffer time, according to embodiments of this disclosure.
Figure 9B:
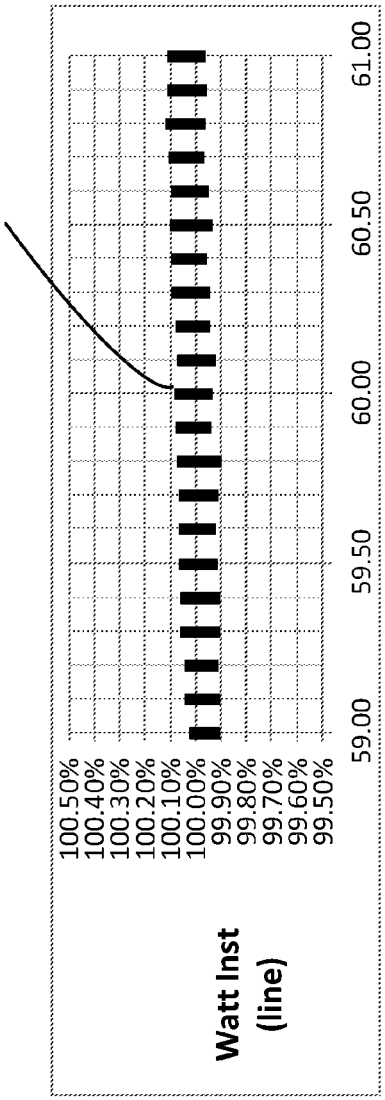

FIGS. 9A and 9B are bar graph examples showing minimum/maximum values of fluctuating power (expressed as a percentage of accuracy (e.g., percentage of registration in a metering device), on the Y-axis) over a sweeping frequency (expressed in Hz on the X-axis). In these graphs, a percentage of 100% corresponds to perfect accuracy (i.e., a meter registered 100% of the energy that was metered by the reference standard meter). In other words, these graphs show the consistency or repeatability of a measurement from one interval to the next. In graph 936 of FIG. 9A, a fixed acquisition buffer length of one second was used, in accordance with the prior art. In graph 938 of FIG. 9B a variable acquisition buffer length was used in accordance with embodiments of this disclosure. As can be seen by a visual comparison of each graph, using a variable acquisition buffer length resulted more consistent and repeatable measurements, and in turn significantly less fluctuation in power.

Figure 10:
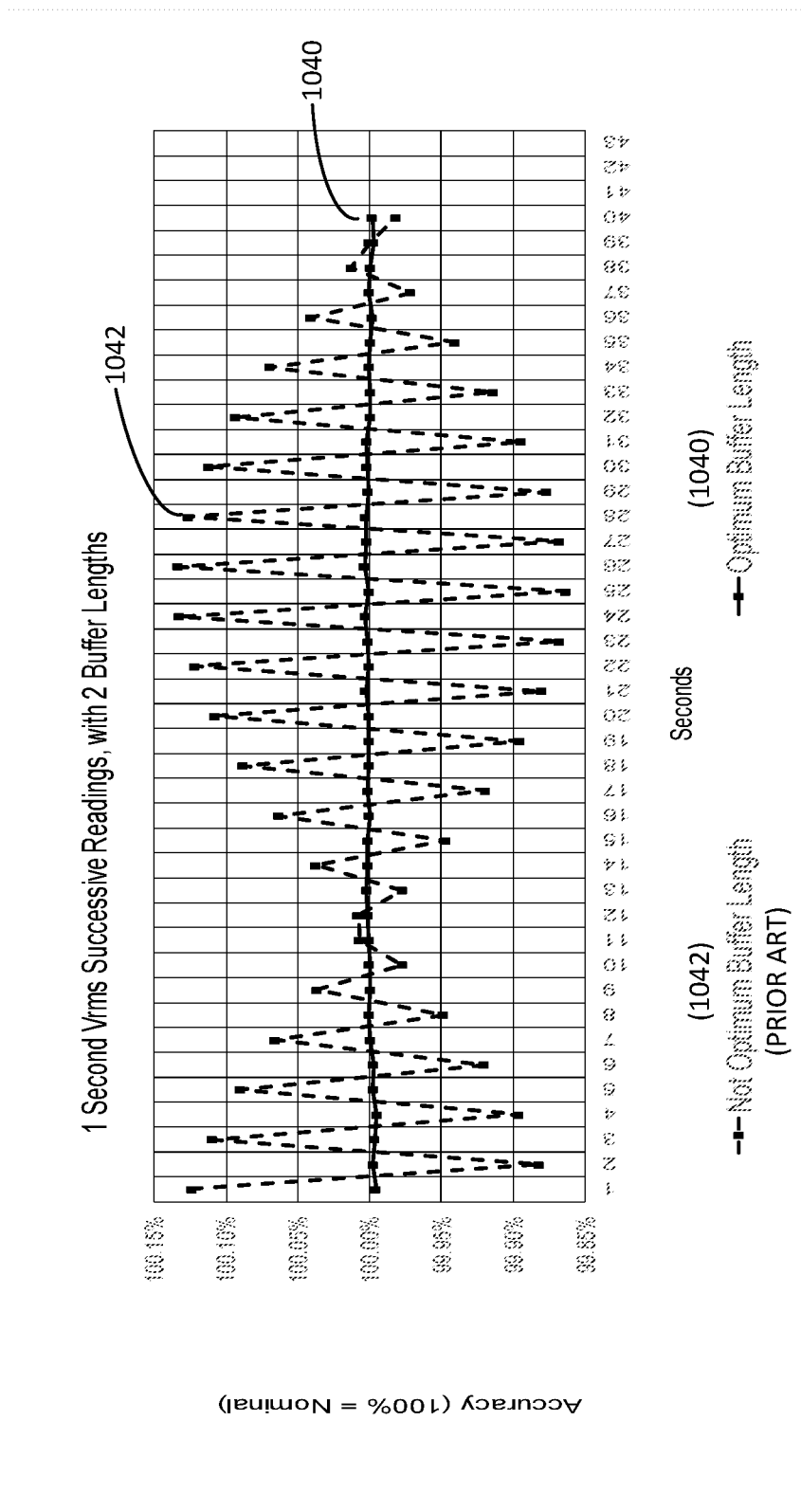
FIG. 10 is a plot example showing accuracies of Vrms readings over time when using a non-optimum acquisition buffer length and an optimum acquisition buffer length.

In FIG. 10, an accuracy of Vrms readings over time are plotted for two acquisition buffer lengths. Plot 1040 shows readings when an acquisition buffer length was used that was optimized in accordance with embodiments described herein (solid line). Plot 1042 shows readings when an acquisition buffer length that was not optimized was used (dashed line). As can be seen in FIG. 10, with the optimized buffer length, the results are very consistently accurate over time, while with the non-optimized buffer length, the accuracy varied greatly over time in comparison. As noted previously, when partial cycles occur in an acquisition buffer, the average value of the partial cycle may be smaller or larger than the average value of a half or full cycle. Therefore, when a partial cycle is included in the acquisition buffer, an unwanted discrepancy in the determined measurement average (e.g., an unwanted inflation or deflation in the average) may occur. When partial cycles are minimized in (or ideally, removed from) the acquisition buffer, the appropriate data is used to determine the cycle averages, resulting in more accurate and consistent measurements.

Figure 11:
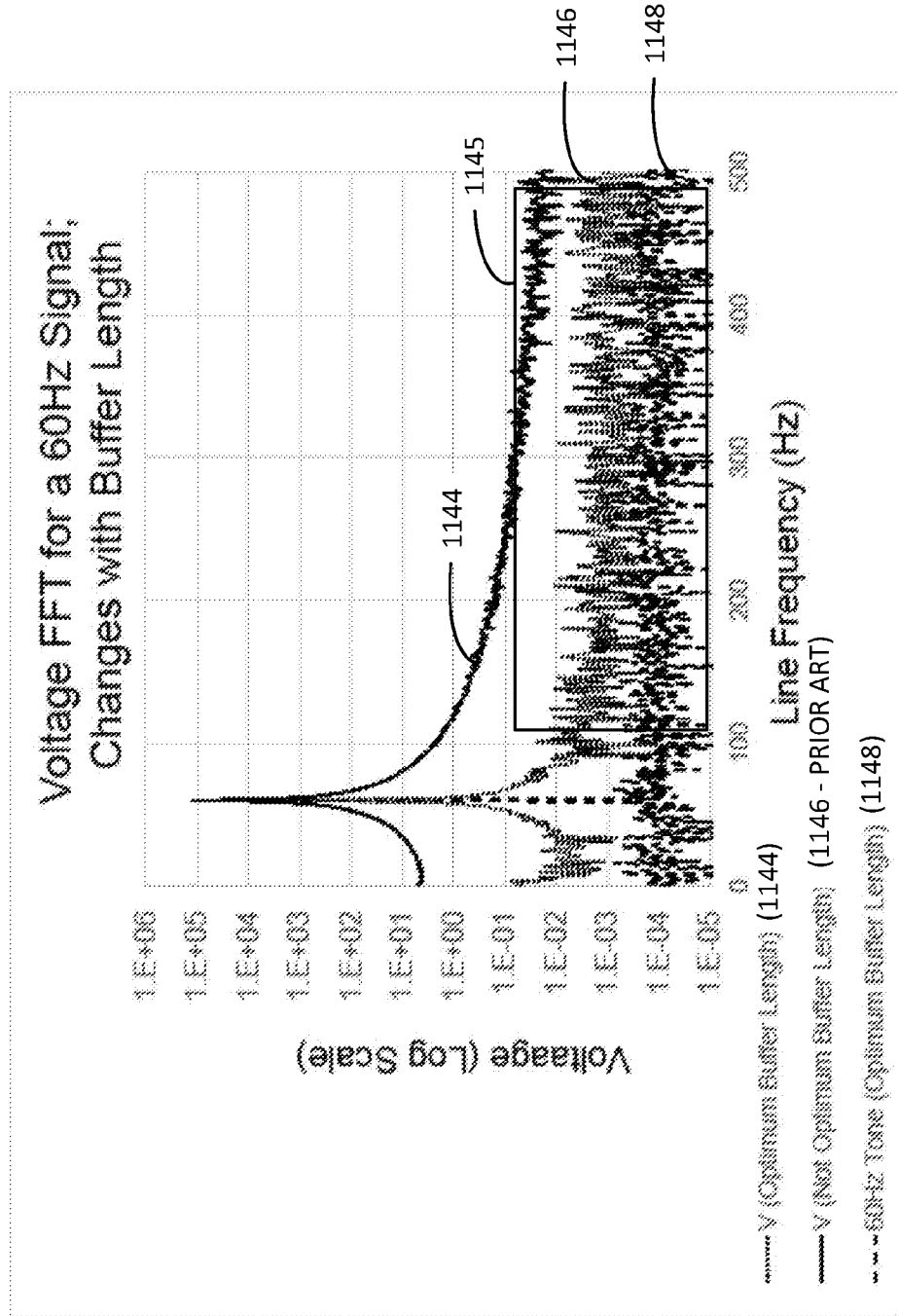
FIG. 11 is a plot example showing a voltage fast Fourier transform (FFT) over line frequency with optimum and non-optimum differences in buffer length, according to embodiments of this disclosure.

FIG. 11 is a plot example showing a voltage fast Fourier transform (FFT) for a 60 Hz signal over line frequency when using optimum and non-optimum acquisition buffer lengths. In FIG. 11, plot 1144 corresponds to the use of a non-optimum (e.g., fixed) acquisition buffer length, in accordance with the prior art. As can be seen from its "rectangular" nature (indicated in the graph by rectangle 1145), spectral leakage appears to be present in plot 1144. A technique called windowing may be needed to reduce this leakage effect, as would be understood by one of ordinary skill in the relevant arts. On the other hand, plot 1146 corresponds to the use of an optimum acquisition buffer length, in accordance with embodiments disclosed herein. Plot 1146 does not appear to be affected by spectral leakage, and no windowing would be required. A 60 Hz tone is shown by plot 1148 for comparison. As can be seen by plot 1146, which is in close comparison with 60 Hz tone plot 1148, optimizing the acquisition buffer length allows a Fourier transform with the fundamental and harmonics to show as a single tone. All of the energy of the fundamental and harmonics is in a single frequency, instead of over several consecutive frequencies. Therefore, there is no need for extra correctional computation such as that required to conduct windowing.

Asynchronous Sigma-Delta ADC

As stated earlier, it would be desirable for energy measurement devices to use less expensive sigma-delta ADCs. However, sigma-delta ADCs are intended to operate at a fixed frequency. If a sigma-delta ADC incurs a frequency rate change when the ADC is actively in operation, the output samples from the ADC may have significant errors due, in part, to the effects of the particular internal modulators and filters used in the ADC. Solutions to this issue will now be described, in accordance with various presented embodiments.

As described earlier with reference to FIG. 3, in a metering device, waveform signal(s) 322 (e.g., input voltage and current signals) may be input to metrology block 104, and a periodic waveform output signal 324 may be output from metrology block 104. Output signal 324 may include metrological data representative of consumption measurement data, for example. Prior to providing output, metrology block 104 may process the input signals via ADC 106, processor(s) 108 and memory 110.

Figure 12:
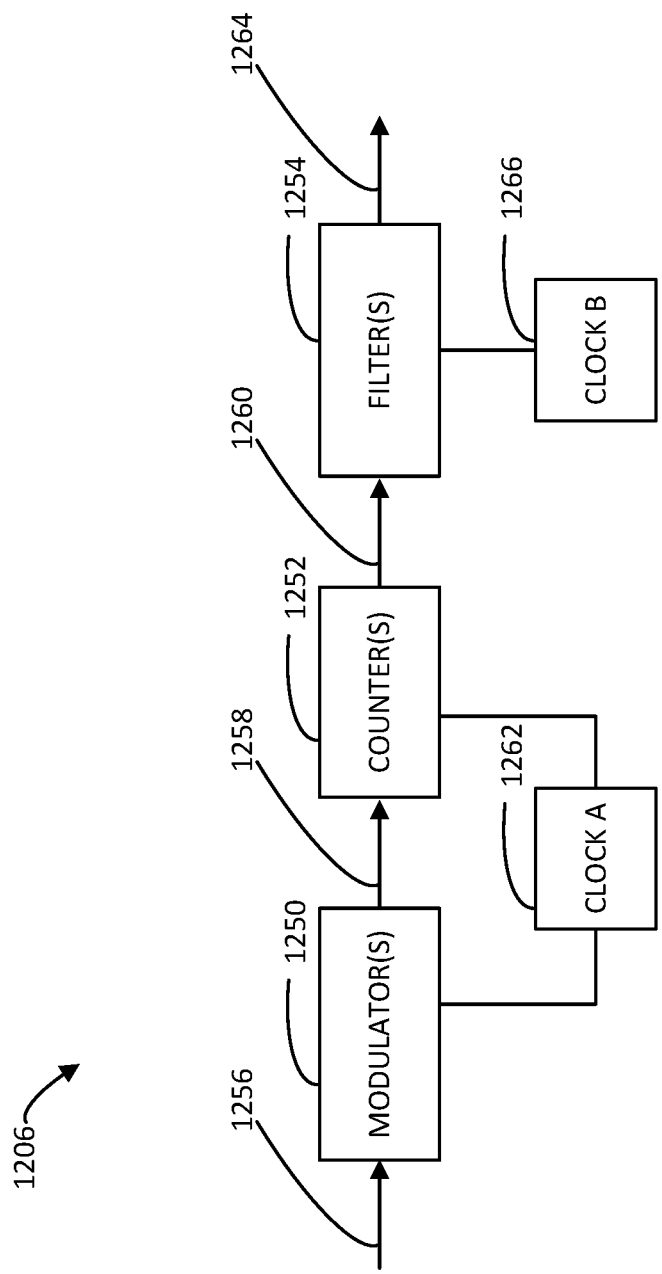
FIG. 12 is a block diagram of an example analog-to-digital converter, according to embodiments of this disclosure.

FIG. 12 is a block diagram of an example ADC 1206 that may be used as ADC 106. ADC 1206 may include one or more modulators 1250, one or more counters 1252, and one or more filters 1254. Modulator(s) 1250 may perform modulation on analog input signal(s) 1256 (e.g., input voltage and current signals) and output modulated signal(s) 1258 (e.g., as one or more N-bit frames). Counter(s) 1252 may integrate modulated signals 1258 and output a data signal 1260 (e.g., as output word frame(s)). Modulator(s) 1250 and counter(s) 1252 may operate in accordance with a clock input 1262. In an example, clock 1262 may set a frequency of an oversampling ratio multiplied by an output word rate (or sampling frequency). Counter(s) 1252 may be an up/down counter that counts +N or −N at each clock cycle. Filter(s) 1254 may be digital filters that read and filter the data signal 1260 and output digital sample(s) 1264 in accordance with a clock input 1266. Clock 1266 may set a frequency equal to the output word rate, or sampling frequency. Filter(s) 1254 may include any type of filters, including but not limited to, low pass filters, comb filters, input response filters, finite input response filters, etc. Filter(s) 1254 may be configured for specific filtering to correct errors that may have been earlier introduced in the signal. For example, filter(s) 1254 may be configured for error term correction, anti-aliasing, gain correction, etc.

As discussed earlier, having an integer number of samples per line cycle is beneficial for some applications of signal processing (including smart metering). When samples are synchronized with the line (e.g., X integer samples per line cycle), it is possible to average a one second buffer on one data cycle. In addition, it allows for easier harmonic analysis using discrete and/or fast Fourier transforms (DFT, FFT), without requiring windowing, and makes the amplitude and angle of each harmonic available for processing various metrological measurements and other useful information (e.g., reactive volt-ampere information (VARs), total harmonic distortion (THD), etc.) It also makes cycle analysis easier (e.g., sag and swell) for voltage quality measurements. In order to be capable of maintaining this synchronization when a change in a line frequency (or phase) occurs, however, it would be expensive to have to require changing or increasing the number of modulators or even full ADCs in a device. A more cost-effective way to accomplish this is by keeping the analog front end the same and changing the digital portion of the ADC (primarily the filtering, for example). When making this change, since the analog modulators oversample, it is still feasible to have a resolution of 1/oversampling ratio on the sampling frequency.

Figure 13:
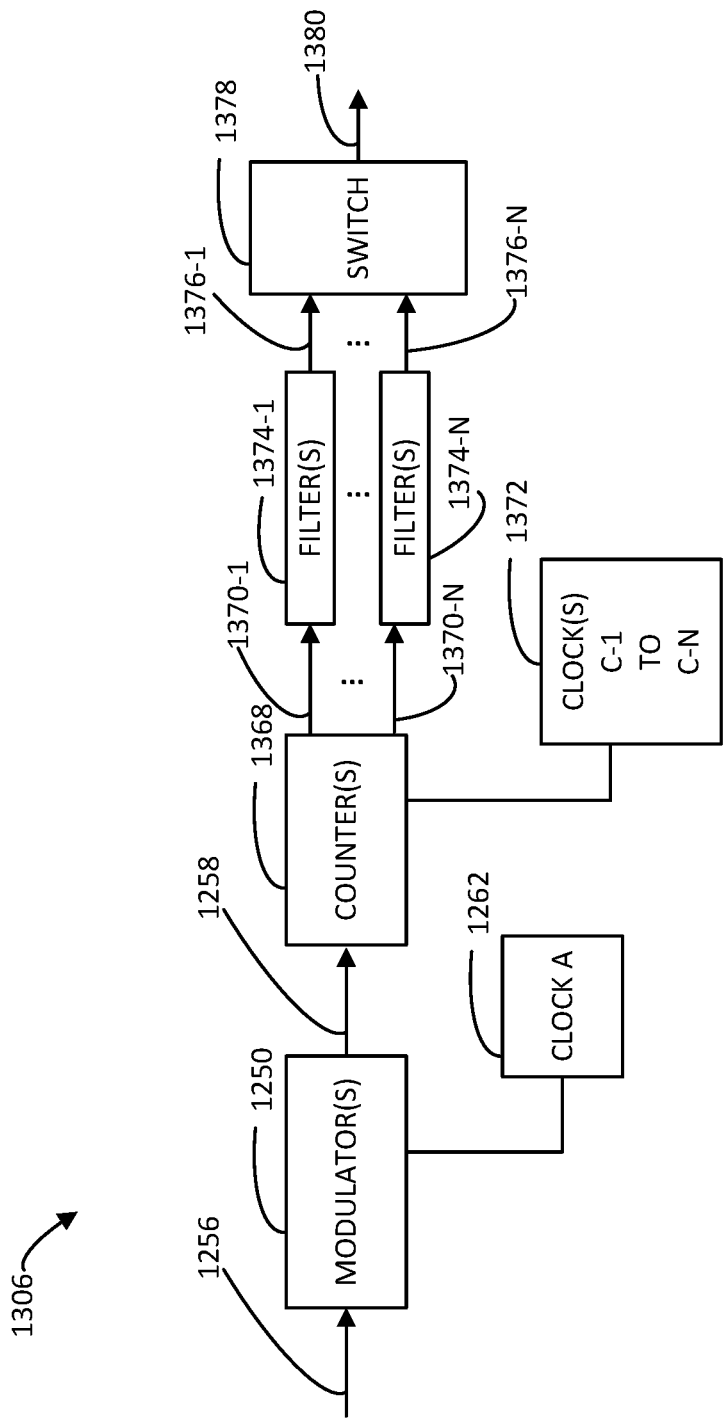
FIG. 13 is a block diagram of an example analog-to-digital converter with multiple sets of filters, according to embodiments of this disclosure.

FIG. 13 illustrates an example ADC 1306 with multiple sets of filters, according to embodiments of this disclosure, that may be used in place of ADC 106 or ADC 1206 to manage the issues discussed above. ADC 1306 may include modulator(s) 1250 that perform modulation on analog input signal(s) 1256 (e.g., input voltage and current signals) and output modulated signal(s) 1258 (e.g., as one or more N-bit frames) in accordance with clock 1262, in a similar manner as what was described above with reference to ADC 1206 in FIG. 12. In ADC 1306, one or more counter(s) 1368 may integrate modulated signals 1258 and output two or more data signals 1370-1 to 1370-N (collectively, 1370) (e.g., as output word frames/sets), in accordance with two or more respective counter clocks 1372. ADC 1306 may also include two or more digital filter sets 1374-1 to 1374-N (collectively, 1374) that read and filter, respectively, the two or more data signals 1370 and output digital samples 1376-1 to 1376-N (collectively, 1376) at respective sampling clock rates (e.g., clocks 1372). ADC 1306 may further include a selection means (e.g., a switch or other selection means) 1378 that can be directed to select which of the output digital samples 1376-1 to 1376-N is to be output from ADC 1306 as digital samples 1380. While the selection means is referred to herein as a switch for readability, other selection means may be used as would be understood by those of ordinary skill in the relevant arts (e.g., data selection circuits, multiplexers (MUX), etc.). One or more of counters 1368 may be up/down counters that count +N or −N at each clock cycle. Clocks 1372 may be at predetermined frequencies, and/or have predetermined phases, equal to the desired respective output word rates, or sampling frequencies and/or phases of each filter set. Filter sets 1374 may include any type of filters, including but not limited to, low pass filters, comb filters, input response filters, finite input response filters, etc. Filters 1374 may be configured for specific filtering to correct errors that may have been earlier introduced in the signal. For example, filters 1374 may be configured for error term correction, anti-aliasing, gain correction, etc.

Figure 14:
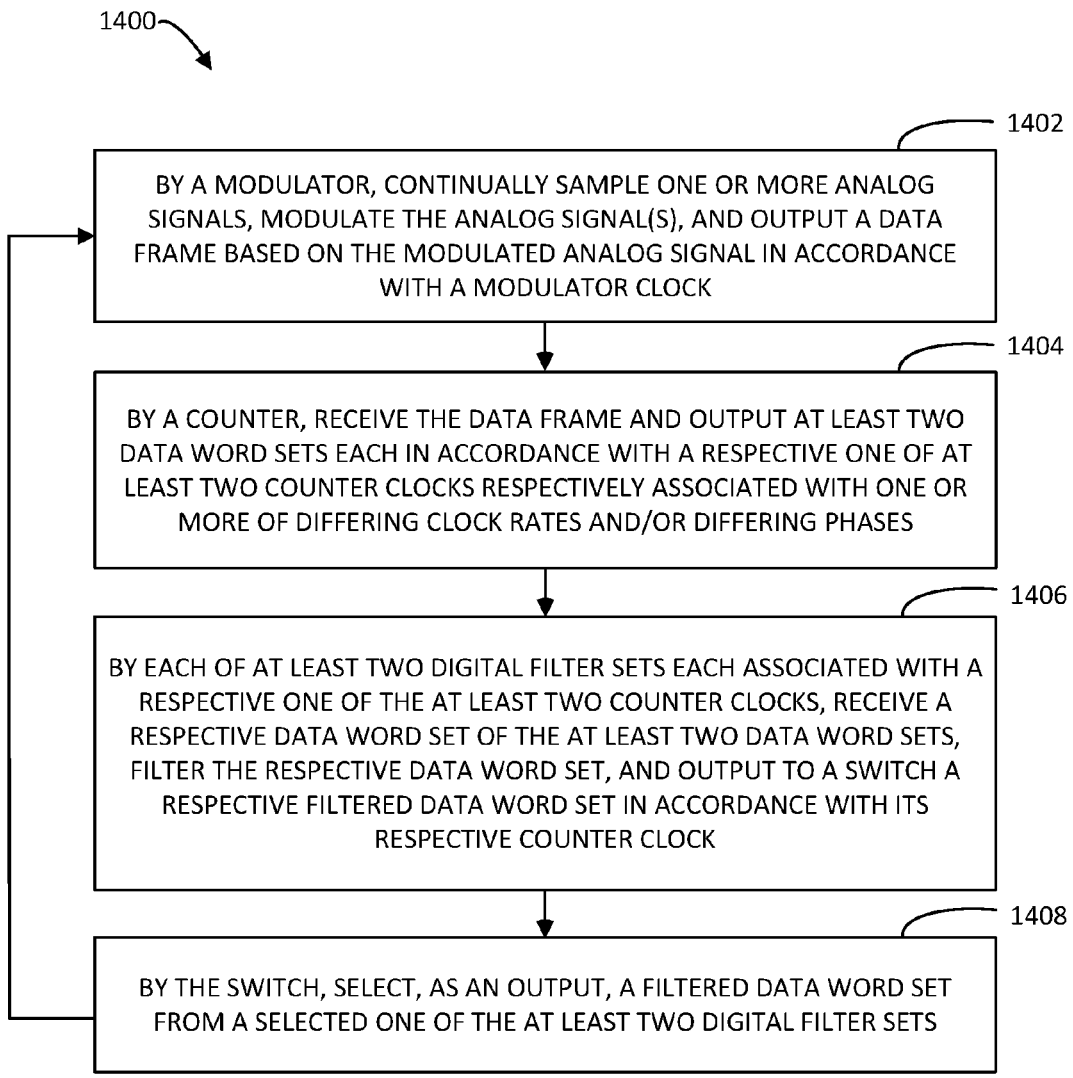
FIGS. 14 and 15 are flow diagrams of example methods of processing a signal, according to embodiments of this disclosure.
Figure 15:
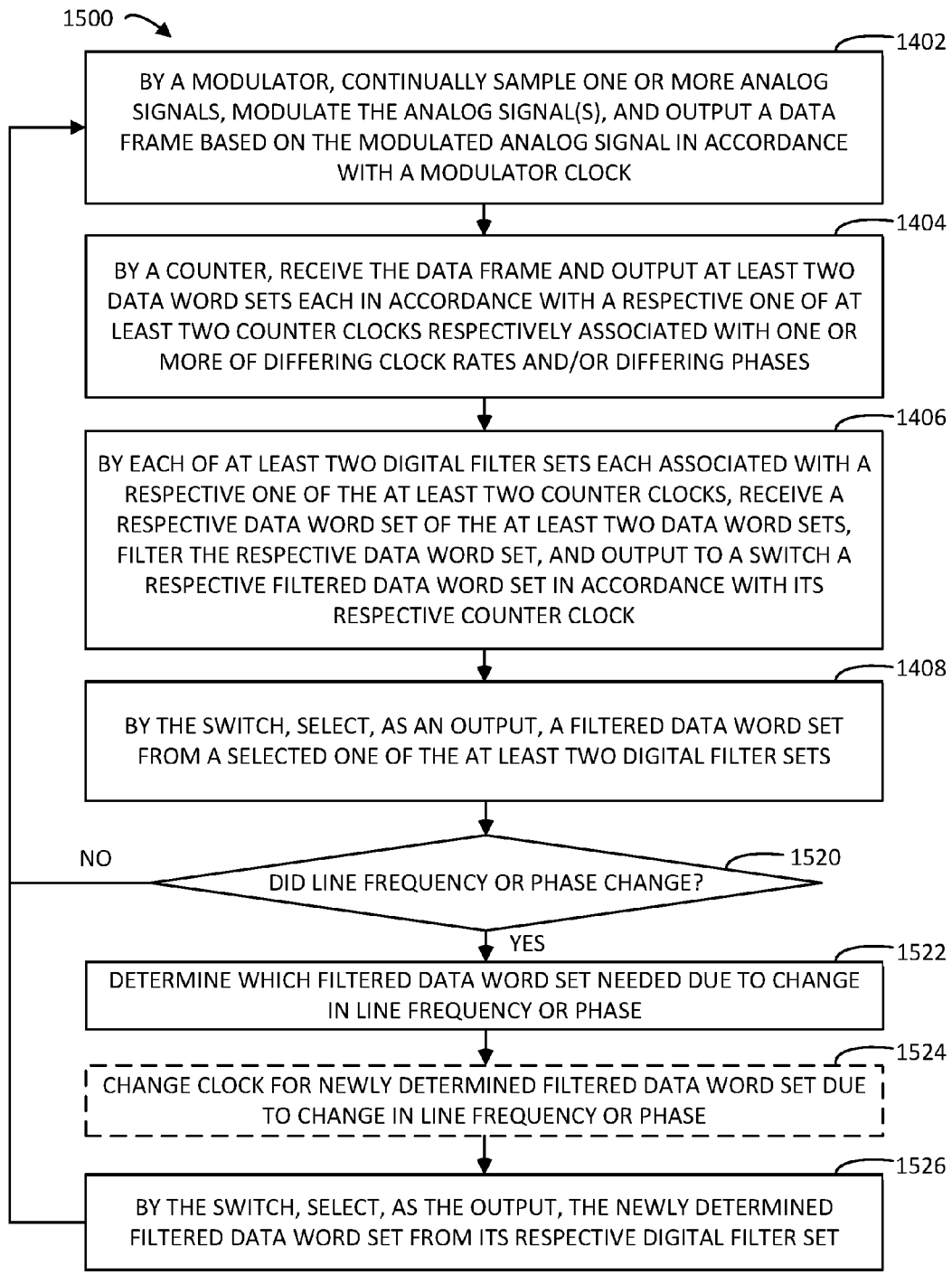

In FIG. 14, a method 1400 that summarizes the process described above with reference to ADC 1306 is as follows, in accordance with embodiments described herein. At 1402, a modulator may continually sample one or more analog signals, modulate the analog signal(s), and output a data frame based on the modulated analog signal(s) in accordance with a modulator clock. At 1404, a counter may receive the data frame and output at least two data word sets each in accordance with a respective one of at least two counter clocks respectively associated with one or more differing clock rates and/or differing phases. At 1406, each of at least two digital filter sets, each associated with a respective one of the at least two counter clocks, may receive a respective data word set of the at least two data word sets, filter the respective data word set, and output to a switch a respective filtered data word set in accordance with its respective counter clock. At 1408, the switch may select, as an output of the ADC, a filtered data word set from a selected one of the at least two digital filter sets. The selected digital filter set may be selected in various ways, according to various embodiments. For example, the selection may be based on an automated selection determination (such as a determination described below with reference to FIGS. 15 and 16), a direction from a signal received from a data collection device (e.g., from a device from central office 214, a mobile data collection device 218, a data collector node 102A, etc., from FIG. 2) or another device, an input by a user via a user interface, etc. The method 1400 may then repeat, by proceeding again at 1402.

As stated earlier, it is beneficial for the output samples to be synchronized with the line. Thus, upon a change in line frequency or phase, it may be desirable to quickly change to a different filtered data word set output in order to more closely (ideally, exactly) align the output samples with the line. This is illustrated in method 1500 of FIG. 15, where in addition to the process of method 1400, it may be determined whether a change in line frequency and/or phase occurs (at 1520). If not, the method may proceed to 1402. If a change in line frequency and/or phase is detected, however, it may be necessary to change the output. In the embodiment shown by method 1500, it may be determined, at 1522, which filtered data word set is needed due to the change in line frequency and/or phase. If necessary, the counter clock associated with the newly determined filtered data word set (and its respective digital filter set) may need to be changed to a new frequency and/or new phase (e.g., to become more closely synchronized with the line frequency and/or phase), as shown in optional step 1524. The switch may select, as the output, the newly determined filtered data word set from its respective digital filter set (at 1526) before repeating. In one example, the digital filter set output may need to change to that coming from a different digital filter set than was previously selected by the switch. In another example, the selected digital filter set output may not need to change, however the counter clock associated with the selected digital filter set may need to be changed.

Figure 16:
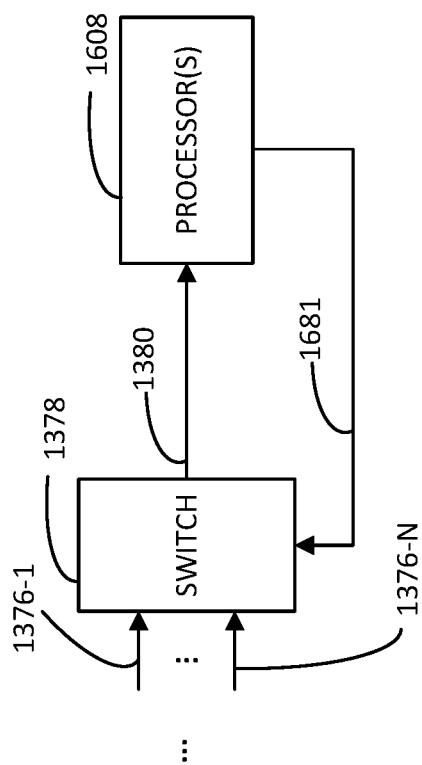
FIG. 16 is a block diagram of an example feedback loop for detecting/reporting changes in line frequency and/or phase.

In an embodiment, as illustrated in FIG. 16, a change in line frequency and/or phase may be detected (e.g., at 1520 of method 1500), the filtered data word set determined (e.g., at 1522 of method 1500), and the switch directed to make a new selection (e.g., at 1526 of method 1500), by a processor 1608 via a feedback loop 1681. In an embodiment, the determination whether to direct the switch to output a different filtered data word set may be based on whether the detected change in frequency and/or phase crosses one or more predetermined thresholds for the frequency and/or phase. In an embodiment, processor 1608 may also, or alternatively, direct one or more of counter clocks 1372 to change in frequency and/or phase due to the change in line frequency and/or phase, in accordance with step 1524 of method 1500.

Figure 17:
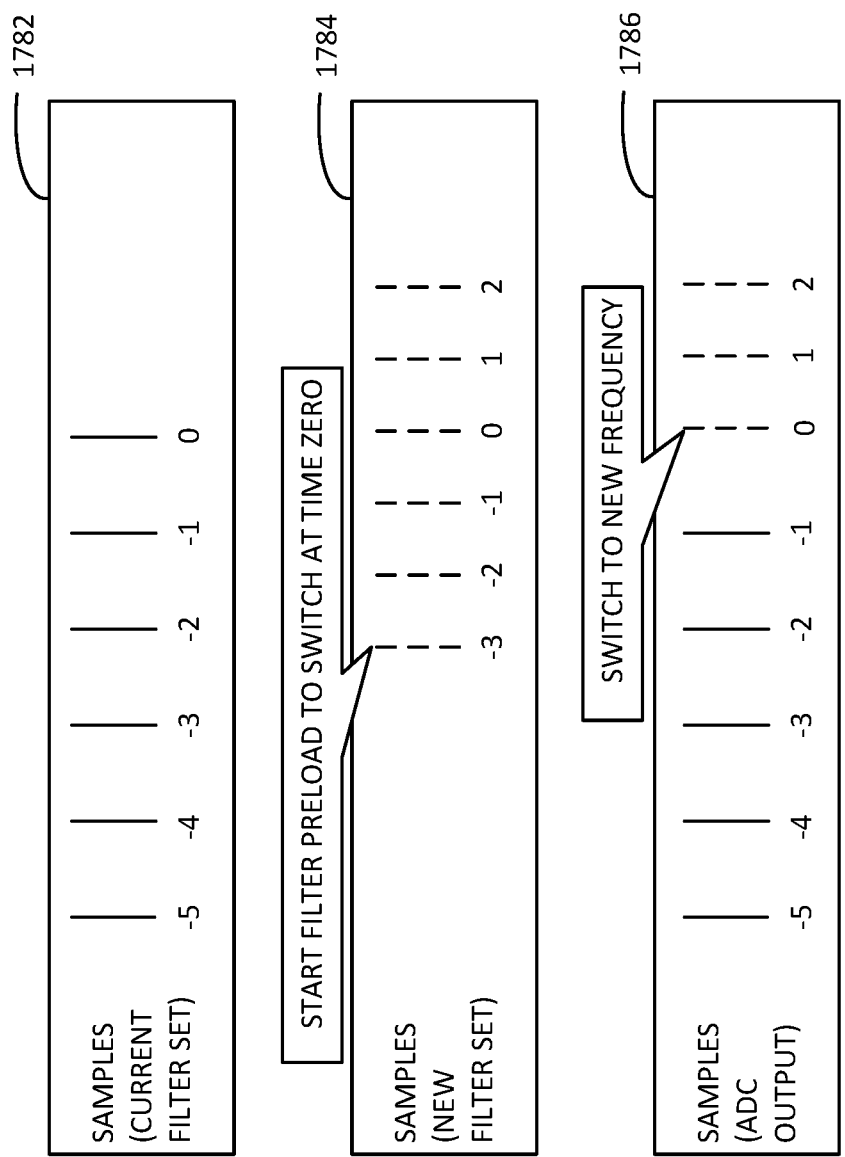
FIG. 17 is an example timing diagram showing a switch from one filter set to another filter set due to a frequency change, according to embodiments of this disclosure.

Upon a line frequency or phase change, it is possible that the output filtered data word sets 1376 from their respective digital filter sets 1374 may become unstable. According to an embodiment, the selection of the switch 1378 to a different filtered data word set from a different digital filter set may be made after the new filtered data word set output stabilizes. The amount of time needed for the new filtered data word set output to stabilize may be a predetermined amount of time (e.g., determined from observation/experimentation, based on characteristics of the filters 1374 or other components of ADC 1306, an estimated amount of time, etc.). In an example, the new filtered data word set output may be considered stabilized after a predetermined number of samples occur after the change in line frequency and/or phase, and/or after the counter clock associated with the selected filtered data word set from its respective digital filter set has changed in frequency and/or phase. This is illustrated in FIG. 17, where timing diagram 1782 shows output samples coming out of the currently chosen filter set at one frequency/phase (denoted by solid lines), and timing diagram 1784 shows output samples coming out of the new filter set (i.e., the new filter set to be selected) at another frequency/phase (denoted by dashed lines). In an example, if it was predetermined that it takes about 4 samples to occur before the new output samples stabilize, then once the line frequency and/or phase changes and it is determined that a selection change is needed (with possibly a counter clock change in the new filter set's respective clock as discussed above) (in this example, at time −3 of timing diagram 1784), then 4 samples of the new filtered data word output (in accordance with its changed counter clock, if necessary) are counted down (in this example, including at time −3), and at time zero, the new output samples may begin to output from the ADC from the newly selected filter set, as shown in timing diagram 1786. As can be seen in FIG. 17, the sample output from the ADC continues to be a continuous data stream with no interruption.

By synchronizing the asynchronous sigma-delta ADC with the line frequency/phase, an integer number of samples per line cycle becomes feasible. With an integer number of samples per line cycle, a single line cycle metrology analysis is possible, with stable measurement from one cycle to the next cycle (e.g., little to no fluctuating power in an electricity metering device). In addition, a one cycle line average is feasible that can be used for computations like harmonic analysis with notable accuracy. Note that processing one cycle is N times faster than processing N cycles. Further, using an acquisition buffer of $2^n$ samples, along with an integer number of line cycles, a direct DFT and/or FFT computation is possible, with no windowing required.

One or more features disclosed herein may be implemented in hardware, software, firmware, and/or combinations thereof, including discrete and integrated circuit logic, application specific integrated circuit (ASIC) logic, and microcontrollers, and may be implemented as part of a domain-specific integrated circuit package, or a combination of integrated circuit packages. The terms software and firmware, as used herein, refer to a computer program product including at least one computer readable medium having computer program logic, such as computer-executable instructions, stored therein to cause a computer system to perform one or more features and/or combinations of features disclosed herein. The computer readable medium may be transitory or non-transitory. An example of a transitory computer readable medium may be a digital signal transmitted over a radio frequency or over an electrical conductor, through a local or wide area network, or through a network such as the Internet. An example of a non-transitory computer readable medium may be a compact disk, a flash memory, SRAM, DRAM, a hard drive, a solid state drive, or other data storage device.

A processing platform of a node device (e.g., device(s) 102 of FIGS. 1 and 2), and/or a data collection device (e.g., mobile data collection device(s) 218, computing device(s) located at central office 214, etc., of FIG. 2) may be embodied in any type of mobile and/or non-mobile computing device. Examples of mobile devices may include, but are not to be limited to, laptop computers, ultra-laptop computers, tablets, touch pads, portable computers, handheld computers, palmtop computers, personal digital assistants (PDAs), e-readers, cellular telephones, combination cellular telephone/PDAs, mobile smart devices (e.g., smart phones, smart tablets, etc.), mobile internet devices (MIDs), mobile messaging devices, mobile data communication devices, mobile media playing devices, cameras, mobile gaming consoles, wearable devices, mobile industrial field devices, etc. Examples of non-mobile devices may include, but are not to be limited to, servers, personal computers (PCs), Internet appliances, televisions, smart televisions, data communication devices, media playing devices, gaming consoles, industrial field devices, metering devices, etc.

Figure 18:
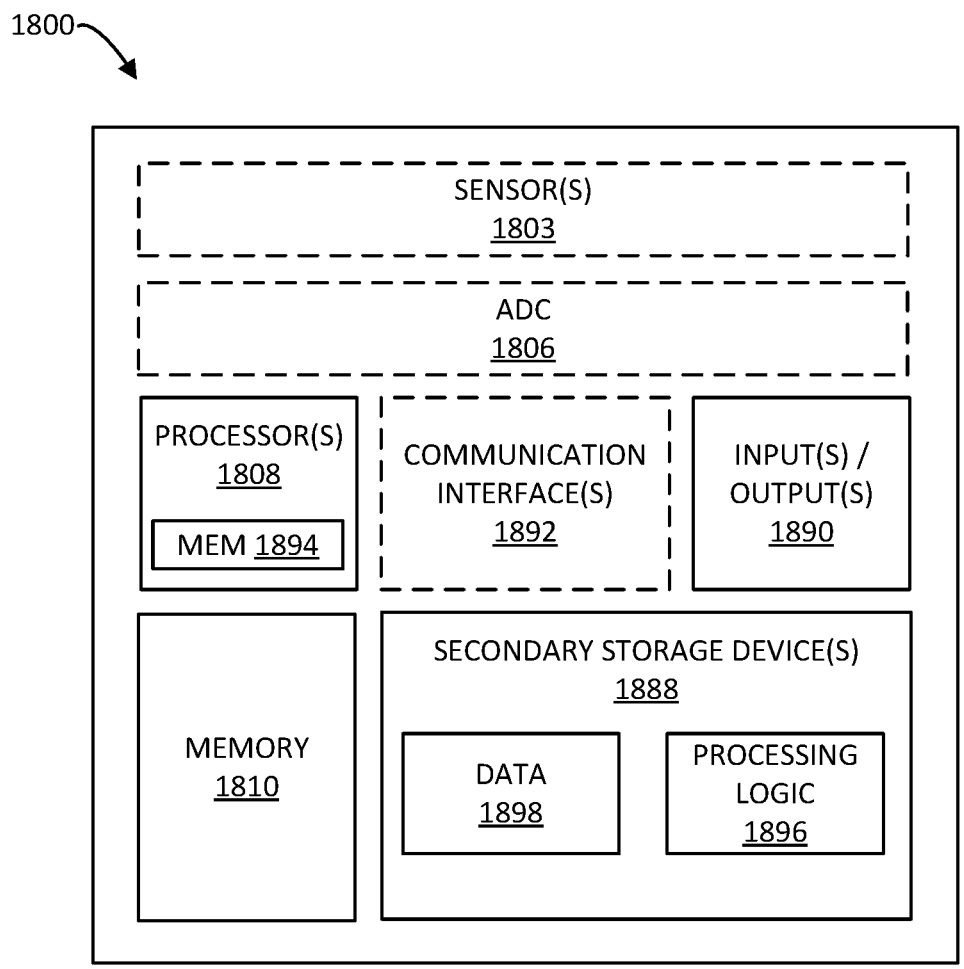
FIG. 18 is a block diagram of an example computing device, according to embodiments of the present disclosure.

FIG. 18 is a block diagram of an example computing device 1800 that may be used in, or as, any of the devices of embodiments described herein. Computing device 1800 may include one or more processors 1808, memory 1810, one or more secondary storage devices 1888, and/or one or more input/output devices 1890, in communication via a bus, line, or similar implementation (not shown). If part of a networked system (e.g., an advanced meter reading (AMR) network or other communications network, as opposed to being a stand-alone metering device), computing device 1800 may also include one or more communication interfaces 1892. Computing device 1800 may also include a power supply (not shown), which may include an interface to an electricity source and/or may include one or more batteries.

Processor(s) 1808 may be implemented by, for example but not limitation, one or more integrated circuits, logic circuits, microprocessors, controllers, etc. Processor(s) 1808 may include a local memory 1894 (e.g., a cache). Memory 1810 may include a volatile and/or a non-volatile memory. Volatile memory may be implemented by, for example but not limitation, Synchronous Dynamic Random Access Memory (SDRAM), Dynamic Random Access Memory (DRAM), RAMBUS Dynamic Random Access Memory (RDRAM) and/or any other type of random access memory device. Non-volatile memory may be implemented by flash memory and/or any other desired type of memory device. Access to memory 1810 may be controlled by a memory controller (not shown). Data stored in local memory 1894 and/or memory 1810 may be used by processor(s) 1808 to facilitate sensor data collection functions, metering functions if embodied in a utility meter, and/or communications, according to embodiments of this disclosure.

Input/output device(s) 1890 may allow a user to interface with processor(s) 1808. Input devices may allow a user to enter data and/or commands for processor(s) 1808. Input devices may include, for example, an audio sensor, a microphone, a camera (e.g., still, video, etc.), a keyboard, a button, a mouse, a touchscreen, a track-pad, a trackball, an isopoint, a voice recognition system, etc. Output devices may provide or present information to a user. Output devices may include, for example, display devices (e.g., a light emitting diode (LED), an organic light emitting diode (OLED), a liquid crystal display, a cathode ray tube display (CRT), a touchscreen, a tactile output device, a printer, speakers, etc.). The input/output device(s) 1890 may be connected to processor(s) 1808, for example, with an interface circuit (not shown). The interface circuit may be implemented by any type of interface standard, such as, for example, an Ethernet interface, a universal serial bus (USB), a PCI express interface, etc. For use with an output device, the interface circuit may include a graphics driver card, chip, and/or processor.

Communication interface(s) 1892 may be implemented in hardware or a combination of hardware and software, and may provide wired or wireless network interface(s) to one or more networks, such as network(s) 216 of FIG. 2. Communication interface(s) 1892 may be a part of, or connected with, the interface circuit discussed above, and/or may include or connect with communication devices such as a transmitter, a receiver, a transceiver, a modem and/or network interface card to facilitate exchange of data with external devices (e.g., computing devices of any kind) via a network, such as network(s) 216.

Secondary storage device(s) 1888 may store processing logic 1896 (e.g., software) to be executed by processor(s) 1808, and/or may store data 1898. Processing logic 1896 and data 1898 may be used by processor(s) 1808 to facilitate any sensor data collection functions, metering functions if embodied in a utility meter, and/or communications between devices, according to embodiments of this disclosure. Processing logic 1896 may include instructions for executing the methodology described herein for sampling input signals, for example. Examples of secondary storage device(s) 1888 may include one or more hard drive disks, compact disk (CD) drives, digital versatile disk (DVD) drives, Blu-ray disk drives, redundant array of independent disks (RAID) systems, floppy disk drives, flash drives, etc. Data and/or processing logic may be stored on a removable tangible computer readable storage medium (e.g., a floppy disk, a CD, a DVD, a Blu-ray disk, etc.) using one or more of the secondary storage device(s) 1888.

In embodiments, computing device 1800 may also include one or more sensors 1803 (e.g., one or more voltage or current sensors if in a metering device, or other sensing device(s)) and/or one or more analog-to-digital converters (ADC) 1806 to sample and process input signals from sensors 1803, for example.

While FIG. 18 depicts each element in one device, some of the elements may be located on one or more other devices, in either close proximity or remote. In example embodiments, one or more components may be located on different chips located within the same physical device, or may be in two different devices in close proximity (e.g., sensor(s) 1803 or ADC 1806 may be located together in one device, or may be located on separate devices in communication with each other). In another example embodiment, some components may be remotely located from each other. For example, in an embodiment, a first device (e.g., a metering device) may include sensor(s) 1803 and possibly one or more of processor(s) 1808, memory 1810, secondary storage device(s) 1888, input(s)/output(s) 1890, and/or communication interface(s) 1892, while ADC 1806 may be remotely located in a second device remote from the first device (e.g., a data collection device such as data collector node 102A, a mobile data collection device 218, or a device at central office 214 of FIG. 2) with its own processor(s) 1808, memory 1810, secondary storage device(s) 1888, input(s)/output(s) 1890, and/or communication interface(s) 1892. In such an example, sensor data may be sent from the first device to the second device for processing at the second device by the ADC, etc. In yet another example, components of the ADC may be located across two or more devices in communication with each other. In such an example, the modulation components (e.g., modulator(s) 1250 and clock 1262) may be located on a first device, and the remaining components (e.g., counter(s) 1368, clock(s) 1372, filters 1374, and switch 1378) may be located on a second device in communication with the first device.

As stated earlier, in metering systems and other applications that require highly accurate output, it is important to control output fluctuations, or manage the effects thereof, due to, for example, sampling frequency and/or phase changes that may occur, or are expected to occur, during operation. Varying the acquisition buffer length and optimizing the number of samples per buffer to minimize the occurrence and/or severity of partial line cycles, in accordance with the embodiments described herein, is one way to improve the accuracy and consistency of the results. In a metering device, having an acquisition buffer with (ideally) no partial line cycles allows energy and root mean square (Vrms, Irms, etc.) measurements to be accurate for a particular time frame. It also allows useful harmonic analysis without additional correction needed. Another way to improve the accuracy and consistency of sampling output is to manage the negative effects and glitches that can occur when a change in line frequency and/or phase occurs during operation. While the glitches may still occur, they can be managed and output errors avoided (or severity lessened) by switching among differing filter outputs, of an ADC, having differing frequencies/phases, in accordance with embodiments described herein. With this solution, the analog modulation portion of the ADC is not changed, and while the digital portion is changed (providing selective filtering options), the changes may be bypassed to allow standard operation of the ADC, if desired. The variable acquisition buffer length and asynchronous sigma-delta ADC solutions described herein may even be combined for more robust output. However, it may be recognized by those of ordinary skill in the relevant arts that using one of these solutions (e.g., the asynchronous sigma-delta ADC) may lessen the need to use the other (e.g., the variable acquisition buffer length). Generally, these solutions are faster and less expensive than other known solutions that may involve more computations and memory and/or use more expensive ADCs.

The particular examples and scenarios used in this document are for ease of understanding and are not to be limiting. For example, while the filter switching feature is described in terms of sigma-delta ADCs, this feature may benefit other types of ADCs as well. As an additional example, although described for use within electrical metering systems, features described herein may be used in many other contexts that may or may not involve electrical metering or even metering at all. The efficiency and cost-saving features discussed herein may be beneficial in many other systems involving sampling of periodic signals and/or single tone signals, including other utility metering systems and other types of systems. Further, while processes and methods are included herein and described in terms of flow diagrams, neither the description nor the flow diagrams are necessarily intended to limit the methods/processes to the order shown.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An analog-to-digital converter with variable output, comprising:

at least one analog modulator configured to continually sample an input analog signal and output a data frame in accordance with a modulator clock;

at least one counter configured to receive the data frame from the at least one analog modulator and output at least two data word sets in accordance with at least two counter clocks, the at least two counter clocks respectively associated with the at least two data word sets and having one or more of differing clock rates or differing phases;

at least two digital filter sets respectively associated with the at least two counter clocks, the at least two digital filter sets configured to each receive and filter a respective data word set of the at least two data word sets and output a respective filtered data word set in accordance with its respective counter clock; and a switch configured to select a filtered data word set of the filtered data word sets from a selected one of the at least two digital filter sets as an output.

2. The analog-to-digital converter of claim 1, wherein the switch is further configured to synchronize a frequency of the outputted filtered data word set with a line frequency by selecting the filtered data word set that is output from its respective digital filter set at a frequency that is substantially equal to the line frequency.

3. The analog-to-digital converter of claim 1, wherein each of the at least two digital filter sets includes one or more of a low pass filter, an input response filter, or a finite impulse response filter.

4. The analog-to-digital converter of claim 1, wherein at least one of the at least two digital filter sets includes one or more corrective filters, the one or more corrective filters including one or more of a filter to correct error terms, an anti-aliasing filter, or a gain corrective filter.

5. The analog-to-digital converter of claim 1, wherein, the switch is further configured to, upon a change of a line frequency or phase to a new line frequency or a new line phase that crosses a predetermined threshold, select a different filtered data word set from a respective different digital filter set.

6. The analog-to-digital converter of claim 5, wherein the counter clock of the at least two counter clocks that is respectively associated with the respective different digital filter set is configured to be changed to one or more of a new frequency or a new phase upon the change of the line frequency or phase.

7. The analog-to-digital converter of claim 6, wherein the switch is further configured to select the different filtered data word set after filtered output from the different digital filter set stabilizes.

8. The analog-to-digital converter of claim 6, wherein the switch is further configured to select the different filtered data word set after a predetermined number of samples occur: after the change of the line frequency or phase or after the respective counter clock that is associated with the respective different digital filter set changes.

9. The analog-to-digital converter of claim 1, wherein the modulator is located in a first device, and the counter, the at least two digital filter sets, and the switch are located in a second device that is communicably coupled with the first device.

10. A signal processing device, comprising:

a processor;

a memory in communication with the processor, the memory storing instructions for execution by the processor; and an analog-to-digital converter in communication with the processor, the analog-to-digital converter configured to continuously sample an input signal, convert each sampled signal into a digital signal, and provide each sampled digital signal to the processor, wherein the analog-to-digital converter includes:
- at least one analog modulator configured to receive the input signal and to output a data frame in accordance with a modulator clock;
- at least one counter configured to receive the data frame from the at least one analog modulator and output at least two data word sets in accordance with at least two counter clocks, the at least two counter clocks respectively associated with the at least two data word sets and having one or more of differing clock rates or differing phases;
- at least two digital filter sets respectively associated with the at least two counter clocks, the at least two digital filter sets configured to each receive and filter a respective data word set of the at least two data word sets and output a respective filtered data word set in accordance with its respective counter clock; and
- a switch configured to select a filtered data word set of the filtered data word sets from a selected one of the at least two digital filter sets as an output.

11. The signal processing device of claim 10, further comprising:
a feedback loop configured to detect a change in a line frequency or phase,
wherein the switch is further configured to, upon the detected change of line frequency or phase to a new line frequency or a new line phase that crosses a predetermined threshold, select a different filtered data word set from a respective different digital filter set.

12. The signal processing device of claim 11, wherein the counter clock of the at least two counter clocks that is respectively associated with the respective different digital filter set is configured to be changed to one or more of a new frequency or a new phase upon the detected change of the line frequency or phase.

13. The signal processing device of claim 10, wherein the signal processing device is a metering device that measures energy consumption, and wherein the processor receives the selected filtered data word set from the analog-to-digital converter and determines energy consumption based on the selected filtered data word set.

14. A method of processing a signal, the method comprising:
by a modulator, and in accordance with a modulator clock,
receiving an analog signal;
modulating the analog signal; and
outputting a data frame based on the modulated analog signal;
by a counter,
receiving the data frame from the modulator; and
outputting at least two data word sets each in accordance with a respective one of at least two counter clocks respectively associated with one or more of differing clock rates or differing phases;
by each of at least two digital filter sets, each digital filter set associated with a respective one of the at least two counter clocks,
receiving a respective data word set of the at least two data word sets from the counter;
filtering the respective data word set; and
outputting, to a switch, a respective filtered data word set in accordance with its respective counter clock; and
by the switch, selecting a filtered data word set of the filtered data word sets from a selected one of the at least two digital filter sets.

15. The method of claim 14, wherein the at least two counter clocks have respective differing clock rates at respective differing predetermined frequencies, and the method further comprises:
by the switch, selecting the filtered data word set that is output from its respective digital filter set at a preferred predetermined frequency of the differing predetermined frequencies.

16. The method of claim 15, wherein the preferred predetermined frequency is a line frequency.

17. The method of claim 14, further comprising:
upon a change of a line frequency or phase to a new line frequency or new phase that crosses a predetermined threshold, select, by the switch, a different filtered data word set from a respective different digital filter set.

18. The method of claim 17, further comprising:
upon the change of the line frequency or phase, change the counter clock of the at least two counter clocks that is respectively associated with the respective different digital filter set to one or more of a new frequency or a new phase.

19. The method of claim 18, wherein the selecting the different filtered data word set is after filtered output from the different digital filter set stabilizes.

20. The method of claim 18, wherein the selecting the different filtered data word set is after a predetermined number of samples occur: after the change of the line frequency or phase or after the respective counter clock that is associated with the respective different digital filter set changes.

21. At least one non-transitory computer-readable medium having computer program logic stored thereon, the computer program logic including instructions that, when executed by a processor, cause the processor to:
direct a modulator to, in accordance with a modulator clock:
continually sample an analog signal;
modulate the analog signal; and
output a data frame;
direct a counter to:
receive the data frame from the modulator; and
output at least two data word sets each in accordance with a respective one of at least two counter clocks respectively associated with one or more of differing clock rates or differing phases;
direct each of at least two digital filter sets, each associated with a respective one of the at least two counter clocks, to:
receive a respective data word set of the at least two data word sets from the counter;
filter the respective data word set; and
output, to a switch, a respective filtered data word set in accordance with its respective counter clock; and
select, via the switch, a filtered data word set of the filtered data word sets from a selected one of the at least two digital filter sets.

22. The at least one non-transitory computer readable medium of claim 21, wherein the instructions further cause the processor to, upon a change of a line frequency or phase to a new line frequency or a new line phase that crosses a predetermined threshold:

direct the switch to select a different filtered data word set from a respective different digital filter set.

23. The at least one non-transitory computer readable medium of claim 22, wherein the instructions further cause the processor to, upon a change of the line frequency or phase to the new line frequency or new line phase:
change the counter clock of the at least two counter clocks that is respectively associated with the respective different digital filter set to one or more of a new frequency or a new phase.

24. The at least one non-transitory computer readable medium of claim 23, wherein the instructions further cause the processor to:
direct the switch to select the different filtered data word set after filtered output from the different digital filter set stabilizes.

25. The at least one non-transitory computer readable medium of claim 23, wherein the instructions further cause the processor to:
direct the switch to select the different filtered data word set after a predetermined number of samples occur: after the change of the line frequency or phase or after the respective counter clock that is associated with the respective different digital filter set changes.

* * * * *